(12) United States Patent
Sun et al.

(10) Patent No.: US 10,642,160 B2
(45) Date of Patent: May 5, 2020

(54) SELF-ALIGNED QUADRUPLE PATTERNING PITCH WALKING SOLUTION

(71) Applicant: GLOBALFOUNDRIES INC., Grand Cayman (KY)

(72) Inventors: Lei Sun, Altamont, NY (US); Guoxiang Ning, Clifton Park, NY (US); Meixiong Zhao, Ballston Lake, NY (US); Erfeng Ding, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/909,071

(22) Filed: Mar. 1, 2018

(65) Prior Publication Data
US 2019/0271918 A1    Sep. 5, 2019

(51) Int. Cl.
*G03F 7/20* (2006.01)
*H01L 21/308* (2006.01)

(52) U.S. Cl.
CPC ...... *G03F 7/70441* (2013.01); *H01L 21/3086* (2013.01); *H01L 21/3088* (2013.01)

(58) Field of Classification Search
USPC .......................................................... 716/53
See application file for complete search history.

(56) References Cited

U.S. PATENT DOCUMENTS

| | | | | |
|---|---|---|---|---|
| 2006/0161452 A1* | 7/2006 | Hess | ........................ | G03F 1/36 716/55 |
| 2008/0072207 A1* | 3/2008 | Verma | ...................... | G03F 1/84 716/52 |
| 2011/0173578 A1* | 7/2011 | Tsai | ........................ | G03F 1/36 716/55 |
| 2013/0311960 A1* | 11/2013 | Tsai | ........................ | G03F 1/36 716/55 |
| 2016/0363853 A1* | 12/2016 | Ning | ........................ | G03F 1/36 |

OTHER PUBLICATIONS

Kim, Ryoung-han, et al.; "Spacer Defined Double Patterning for Sub-72 nm Pitch Logic Technology"; Optical Microlithograhpy XXIII of SPIE vol. 7640; 2010.
Robertson, Stewart, et al.; Simulation of spacer-based SADP (Self-Aligned Double Patterning) for 15nm Half Pitch; Optical Microlighogryaphy XXVI of SPIE vol. 8683;2013.

* cited by examiner

*Primary Examiner* — Mohammed Alam
(74) *Attorney, Agent, or Firm* — David Cain; Hoffman Warnick LLC

(57) ABSTRACT

A self-aligned quadruple patterning (SAQP) process for forming semiconductor devices utilizes a look-up table based on lithography and etch profiles to improve the critical dimension(s) of semiconductor structures such as semiconductor fins. The look-up table may include lithography and etch data, including critical dimension (CD) and sidewall angle (SWA) data for intermediate as well as final structures formed during fabrication, and may be used to improve fin CD and fin pitch in device architectures that include densely-arrayed, semi-densely arrayed and nested structures.

20 Claims, 10 Drawing Sheets

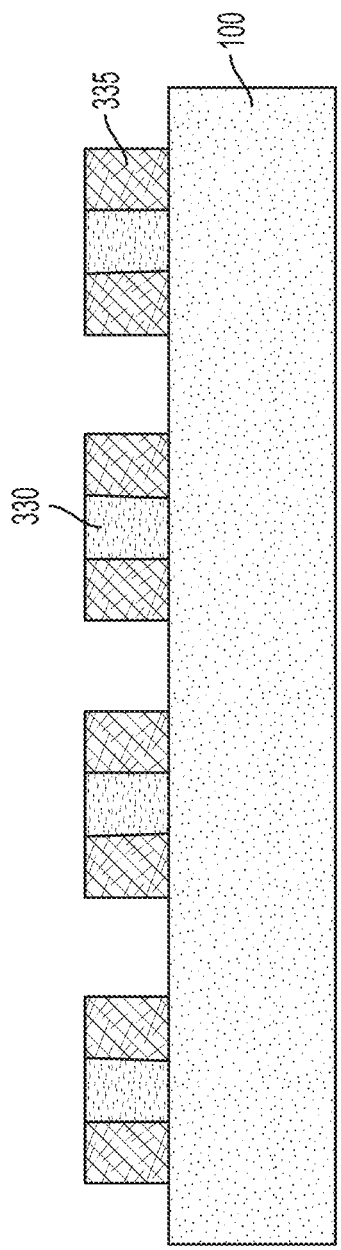
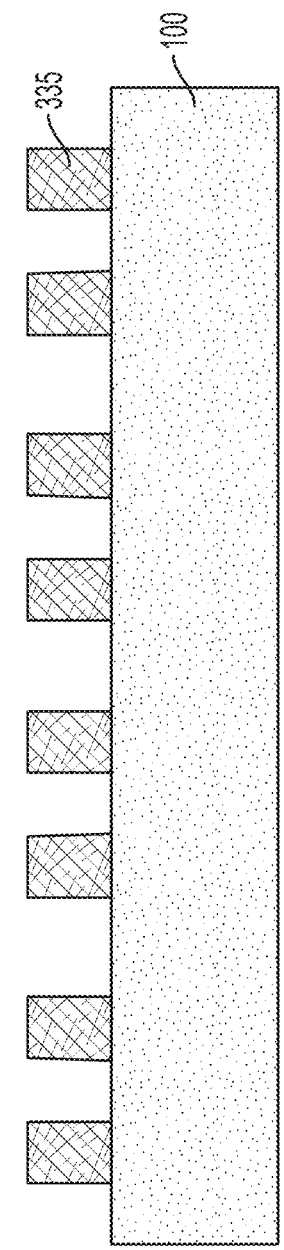

SELF-ALIGNED QUADRUPLE PATTERNING PITCH WALKING SOLUTION

BACKGROUND

The present application relates generally to the manufacture of semiconductor devices, and more specifically to a method for forming a lithography reticle, e.g., for a self-aligned quadruple patterning (SAQP) process.

Advances in integrated circuit (IC) materials and design have yielded generations of ICs where successive generations have smaller and more complex circuits. As ICs evolve, the functional density (i.e., the number of interconnected devices per unit area) has generally increased and the critical dimension (i.e., the minimum feature size) has decreased. While dimensional scaling improves performance, increases production efficiency, and lowers costs, it has also increased the complexity of processing and manufacturing.

In the manufacture of integrated circuit (IC) chips at advanced technology nodes, for example, 14, 10 or 7 nm technologies, three-dimensional structures are increasingly used to define transistor devices.

Fully-depleted devices such as fin field effect transistors (FinFETs), for instance, enable scaling of next generation gate lengths to 14 nm and below. Fin field effect transistors present a three-dimensional architecture where the transistor channel is raised above the surface of a semiconductor substrate, rather than locating the channel at or just below the surface. With a raised channel, the gate can be wrapped around the sides of the channel, which provides improved electrostatic control of the device.

The manufacture of FinFETs typically leverages a self-aligned process to produce extremely thin fins, e.g., 20 nm wide or less, on the surface of a substrate using selective-etching techniques. A gate structure is then deposited to contact multiple surfaces of each fin to form a multi-gate architecture.

With reference to the cross-sectional scanning electron microscope (SEM) micrograph of FIG. 1, a plurality of fins 121, 122, 123, etc. are arrayed over a semiconductor substrate 100. A gate 130, which typically includes one or more gate dielectric layers and one or more gate conductor layers, may be formed as a repeating structure that overlays the fins in an orthogonal dimension.

In certain structures, the plurality of fins 121, 122, 123 may be constructed as an array of repeating, equally-spaced, substantially vertical structures. In the illustrated architecture, first fin 121 has a critical dimension (CD), i.e., width equal to w1, second fin 122 has a width w2, and third fin 123 has a width w3.

A challenge in the fabrication of such repeating structures, however, is the control of the variability in the critical dimension as well as the pitch (d) or spacing (s) between neighboring features. Such variability is ubiquitous in conventional sidewall image transfer (SIT) photolithography techniques, for example, which are used to form finely-spaced fins.

As will be appreciated, the phenomenon of "pitch walking" describes the occurrence of variability in the periodicity between structures, such as semiconductor fins within an array of fins. In the illustrated example of FIG. 1, for instance, the intra fin spacing s12 between first fin 121 and second fin 122 is greater than the intra fin spacing s23 between the second fin 122 and third fin 123.

In some structures, an irregular fin spacing (and/or gate spacing) may result in the unintentional variation in performance of different transistors, which negatively impacts yield and increases cost.

SUMMARY

Notwithstanding recent developments, there is a need for improved methods of semiconductor device manufacture and feature patterning. The present application relates to method of preparing data for forming a lithography reticle for use in defining structures on a semiconductor substrate using, for example, a self-aligned quadruple patterning (SAQP) method.

In particular embodiments, a multi-dimensional look-up table that includes both post-lithography and post-etch profile information for a device structure is used to improve patterning and etching processes and the uniformity of the resulting device geometry by providing dimensionally-aware re-targeting of a lithography reticle during manufacture thereof. Thus, pitch walking and self-aligned quadruple patterning space issues associated with the formation of advanced node structures may be resolved, particularly for non-uniform device architectures.

Non-uniform architectures may include dense, semi-dense and nested structures within different regions of the same substrate. As will be appreciated, the development of photolithographic and etch processes that achieve a uniform CD across different regions of a substrate that present different feature densities as part of the design intent may be challenging.

According to certain embodiments, a method of providing a reticle layout for an integrated circuit includes defining an initial reticle layout corresponding to a pattern to be printed, changing a critical dimension of the initial reticle layout to form a first updated reticle layout by adding a bias from a look-up table, performing an optical proximity correction convergence simulation on the first updated reticle layout to form a second updated reticle layout, and outputting the second updated reticle layout to a mask writer.

A further method of providing a reticle layout for an integrated circuit includes defining an initial reticle layout corresponding to a pattern to be printed, and creating a multi-dimensional matrix for a plurality of initial reticle layouts, wherein the dimension values of the matrix are selected from the group consisting of a post-lithographic critical dimension, a post-lithographic sidewall angle, a first post-etch critical dimension, a first post-etch sidewall angle, a second post-etch critical dimension, and a second post-etch sidewall angle, and elements of the multi-dimensional matrix comprise CD uniformity or pitch walking values.

A value from each of at least two dimensions of the matrix is selected, where one of the selected values is from the post-lithographic critical dimension, such that the selected values correspond to an improved, e.g., minimum, CD uniformity or pitch walking value, and the selected value from the post-lithographic critical dimension defines an improved post-lithographic critical dimension.

The method further includes defining an improved reticle layout CD having an improved, e.g., minimum, CD uniformity value or pitch walking value based on the improved post-lithographic critical dimension, defining an improved reticle layout based on the improved reticle layout CD, performing an optical proximity correction convergence simulation on the improved reticle layout to form an output-ready reticle layout, and outputting the output-ready reticle layout to a mask writer.

In accordance with further embodiments of the present application, a method of providing a reticle layout for an integrated circuit includes defining a initial reticle layout corresponding to a pattern to be printed, and transferring the pattern to be printed to a first masking layer disposed over a first mandrel layer to form a patterned first masking layer, wherein the patterned first masking layer has a post-lithographic critical dimension and a post-lithographic sidewall angle.

The first mandrel layer is etched using the patterned first masking layer as an etch mask to form a first mandrel disposed over a second mandrel layer, wherein the first mandrel has a first post-etch critical dimension and a first post-etch sidewall angle.

The method further includes forming a first spacer layer over sidewalls of the first mandrel, removing the first mandrel to define a second masking layer comprising the first spacer layer, wherein the second masking layer is disposed over a second mandrel layer, and etching the second mandrel layer using the second masking layer as an etch mask to form a second mandrel disposed over a semiconductor substrate, wherein the second mandrel has a second post-etch critical dimension and a second post-etch sidewall angle.

A second spacer layer is then formed over sidewalls of the second mandrel, and the second mandrel is removed to define a third masking layer comprising the second spacer layer. The semiconductor substrate is etched using the third masking layer as an etch mask to form a pattern having a CD uniformity value and a pitch walking value.

A multi-dimensional matrix is created for a plurality of such initial reticle layouts, wherein the dimension values of the matrix are selected from the post-lithographic critical dimension, the post-lithographic sidewall angle, the first post-etch critical dimension, the first post-etch sidewall angle, the second post-etch critical dimension, and the second post-etch sidewall angle. The elements of the multi-dimensional matrix include CD uniformity or pitch walking values.

A value from each of at least two dimensions of the matrix is selected, where one of the selected values is from the post-lithographic critical dimension, such that the selected values correspond to an improved, e.g., minimum, CD uniformity or pitch walking value. The selected value from the post-lithographic critical dimension defines an improved post-lithographic critical dimension.

The method further includes defining an improved reticle layout CD having the improved CD uniformity value and pitch walking value based on the improved post-lithographic critical dimension, forming a look-up table for the pattern to be printed, wherein the look-up table contains the improved reticle layout CD, defining an improved reticle layout based on the look-up table, and performing an optical proximity correction convergence simulation on the improved reticle layout to form a reticle layout. The reticle layout can be output to a mask writer.

BRIEF DESCRIPTION OF SEVERAL VIEWS OF THE DRAWINGS

The following detailed description of specific embodiments of the present application can be best understood when read in conjunction with the following drawings, where like structure is indicated with like reference numerals and in which:

FIGS. 3A-3H are schematic illustrations of a self-aligned quadruple patterning (SAQP) process showing the sidewall angle and critical dimensions for a patterned layer of photoresist used to define a first mandrel, and the sidewall angles and critical dimensions for first and second mandrels;

DETAILED DESCRIPTION

Figure 1:
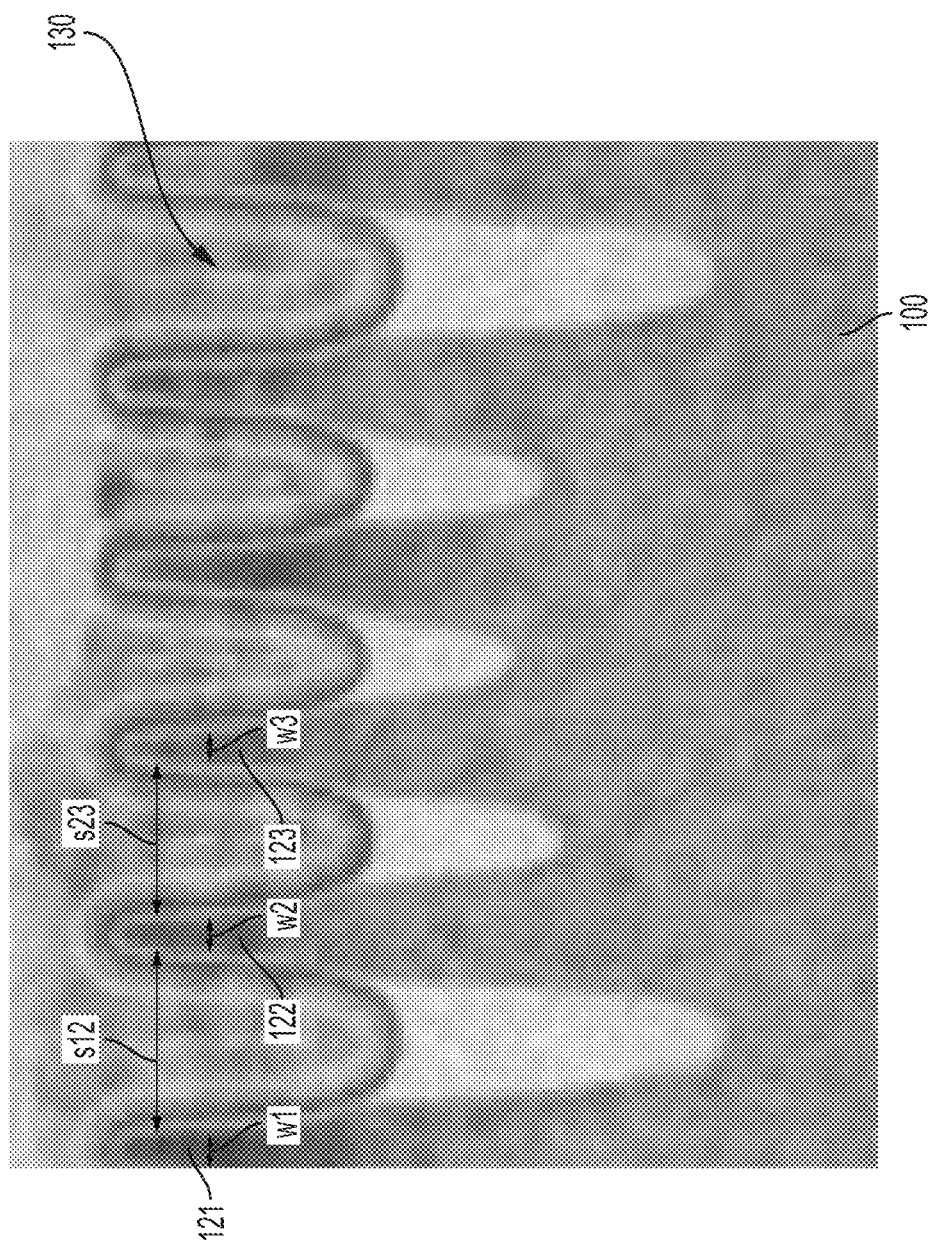
FIG. 1 is a cross-sectional scanning electron microscope (SEM) micrograph of an array of semiconductor fins formed over a semiconductor substrate having an irregular intra fin spacing.

Reference will now be made in greater detail to various embodiments of the subject matter of the present application, some embodiments of which are illustrated in the accompanying drawings. The same reference numerals will be used throughout the drawings to refer to the same or similar parts.

Disclosed is a method where simulated post-lithographic and post-etch profile data are incorporated into the creation of a photomask for IC manufacture. The data can be stored in, and accessed from, a look-up table and can be correlated to post-lithography critical dimension (CD) and sidewall angle (SWA) data, as well as post-etch critical dimension (CD) and sidewall angle (SWA) data associated with structures formed on a semiconductor substrate.

As will be appreciated, in the production of an integrated circuit (IC) device, computer-aided design (CAD) tools are used to generate an IC schematic or design, which can include an assemblage of various structures that are intended to perform a desired function. The IC device schematic is transformed into a physical representation or layout, which is then transferred onto or into a semiconductor substrate. In particular embodiments, computer-aided design (CAD) tools render the various circuit elements into discrete shapes, which are embodied in the final, physical device. These shapes define the individual elements of a circuit, such as semiconductor fins, metal interconnects, source/drain regions, gate electrodes, etc. The IC device can be any type of circuit, such as a signal processor, static or dynamic random access memory, microcontroller or system-on-chip device.

The software programs used by the CAD systems to produce layout representations are typically structured to operate under a set of pre-established design rules in order to produce a functional circuit. The design rules are, at least in part, determined by the manufacturability or patternability of a given layout, which may derive from limitations associated with design as well as processing. For instance, design rules may define the space tolerances between adjacent structures or elements subject to a given lithographic processing window.

Provided with a circuit layout, a photolithography process is used to transfer the desired circuit pattern onto a semiconductor substrate to achieve an overall desired circuit performance. The desired circuit patterns are typically represented as opaque or transparent regions on a template such as a photomask or reticle.

Photolithography typically involves forming a layer of photoresist on the surface of the semiconductor substrate (or on one or more layers provided thereon). In certain embodiments, the photomask is placed over the substrate between a source of radiation and an optical lens system. The radiation source may output visible or ultraviolet radiation, for example. The optical lens system may form part of a stepper or scanner apparatus.

When radiation from the source is directed onto the photomask, it is focused by the optical lens system to generate an image on the substrate that is representative of the pattern on the photomask. Radiation that passes through the transparent regions of the photomask exposes the underlying photoresist layer, while remaining portions of the photoresist layer are unexposed. The exposed photoresist can then be developed, and the reticle pattern realized in the layer of the photoresist. The patterned photoresist, which may be characterized by measurable or simulated parameters such as critical dimension (CD) and sidewall angle (SWA), can be used as a masking layer for etching exposed regions of the substrate.

Inspection or experimental testing of the devices can be performed at various stages of the manufacturing process to verify that the reproduced features and structures are within specification limits. Associated metrology may include imaging and measuring the features and structures on the substrate, such as by obtaining scanning electron microscopy (SEM) images of various regions, acquiring critical dimension (CD) measurements of particular structures, and/or acquiring performance data such as resistivity or loss measurements.

Optical proximity correction (OPC) algorithms pre-correct shapes formed on a photomask by segmenting the shape edges and shifting the position of the segments by minor amounts. OPC software emulates the physical and optical effects that are principally responsible for the non-fidelity of mask shapes printed on the substrate.

In various embodiments, optical proximity correction involves running a computer simulation that takes an initial data set including information related to the desired pattern or layout, and generating an amended data set by manipulating the initial data set to compensate for errors between a transferred pattern and a desired pattern. A disconnect between the reticle pattern and the realized pattern may be due to one or more of process variability, geometric effects such as loading or shadowing effects, and etching phenomena.

That is, optical proximity correction is commonly used to compensate for image errors resulting from diffraction or process effects. The diffraction of light in optical lithography systems, for instance, is an obstacle to feature size scaling. The implementation of OPC addresses at least in part the limitations of light to maintain edge placement (e.g., patterned or etched structure) fidelity of an original design after processing. OPC endeavors to achieve a reticle design that generates a printed structure that matches the design intent, including feature size and placement. An OPC rule set can be applied to layout data to generate a corrected layout data set.

Figure 2:
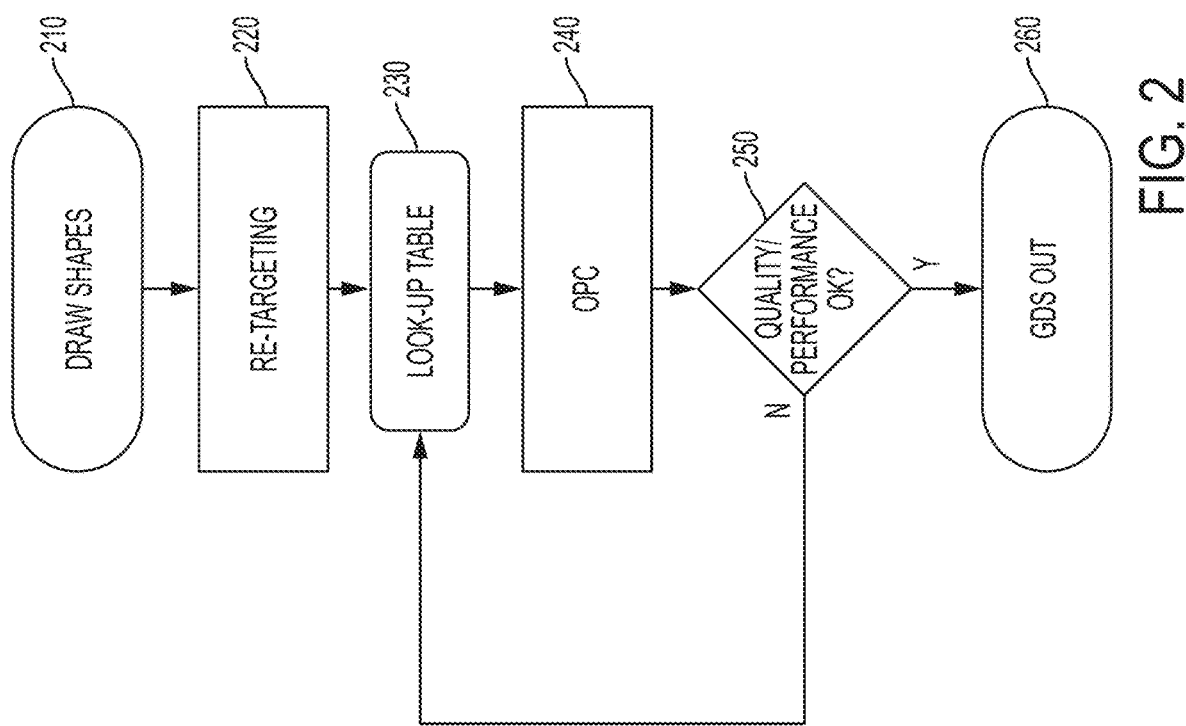
FIG. 2 is a flowchart showing the introduction of a repair flow based on the generation and application of a look-up table into a method of manufacturing a photomask.

In accordance with various embodiments, and with reference to the flow chart of FIG. 2, an example method of providing a reticle layout for an integrated circuit includes the steps of defining a reticle layout corresponding to a pattern to be printed (step 210), modifying the reticle layout to change at least one critical dimension of the reticle layout (step 220), performing an optical proximity correction (OPC) convergence simulation on the reticle layout (step 240), and subject to a pre-determined quality or performance evaluation (step 250), outputting the reticle layout to a photomask writer (step 260).

Each iteration of the OPC performs a simulation and determines if the pattern edge movement satisfies an edge placement error (EPE), which is a quantitative representation of the deviation of the edges of a simulated mask image with respect to the edges of the target image. Typically, EPE tolerances are expressed as geometric rules or constraints on the image shapes relative to shapes on the same physical layer. If the image does not remain within tolerance or the allowable EPE, the segment is iteratively moved forward or backward until all of the simulated image edges are located within an accepted tolerance of the location of the target image edges. Eventually, the final corrected photomask layout is output.

The pattern, which may correspond to a semiconductor fin or a trench structure, for example, can be characterized by a CD uniformity value and may be formed using a self-aligned quadruple patterning process. According to exemplary embodiments, post-lithography and post-etch structural data may be considered during the step of modifying the reticle layout by utilizing a look-up table to perform a modification or repair flow (step 230).

Correction to the lithography target critical dimension can be performed prior to OPC (i.e., static correction) or during OPC (i.e., dynamic correction). In certain embodiments, a dynamic correction can take into account a predicted photoresist profile.

Before describing various embodiments in further detail, reference is made to FIGS. 3A-3H, which depict various inter-feature dimensions, including pitch, CD and sidewall angle, associated with a double sidewall image transfer process, i.e., self-aligned quadruple patterning. Generally, a double sidewall image transfer process utilizes a spacer layer on each side of a mandrel as an etch mask to form a successive mandrel or structure.

Figure 3A:
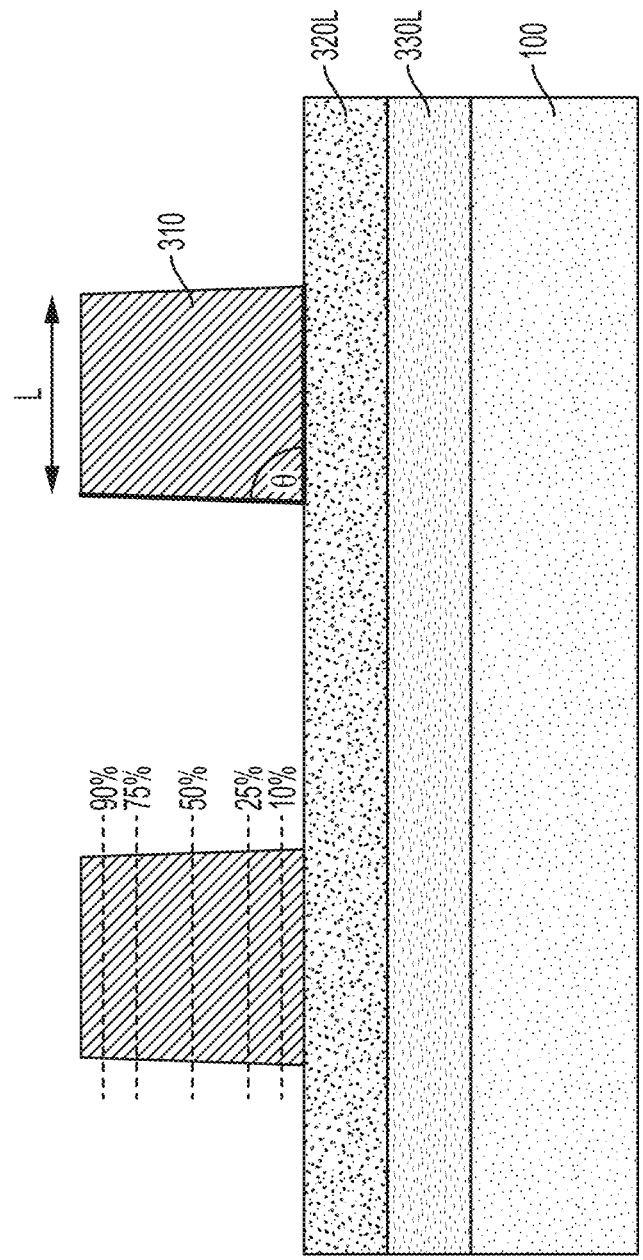

Referring to FIG. 3A, a structure includes a semiconductor substrate 100 and formed over the substrate 100, from top to bottom, a patterned lithography stack 310, a first mandrel layer 320L and a second mandrel layer 330L. The patterned lithography stack 310 may include a layer of photoresist. Optionally, although not separately shown, the photolithography stack 310 may include additional layers, such as an organic planarization layer, adhesion-promoting layer, anti-reflective coating, etc. The patterned lithography stack 310 may be characterized by a post-lithographic critical dimension (L1) and a post-lithographic sidewall angle (Θ). The patterned lithography stack 310 may define a line pattern, for example.

Figure 3B:
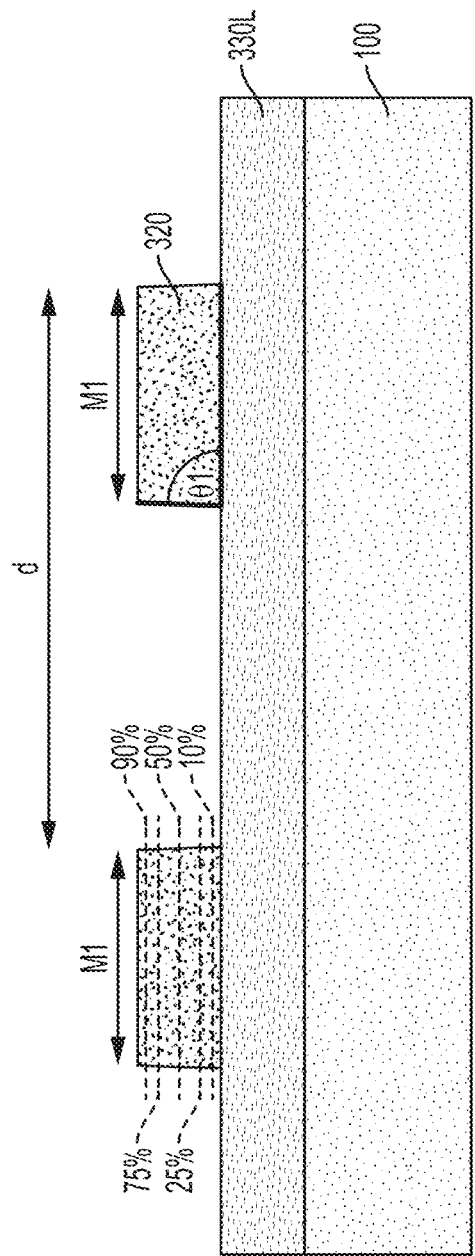

Referring to FIG. 3B, using the patterned lithography stack 310 as an etch mask, the pattern is transferred into the first mandrel layer 320L to form a set of first mandrels 320. The remaining lithography stack is then removed. The set of first mandrels 320, which may be arrayed at a pitch (d), may be characterized by a post-etch profile critical dimension (M1) and a post-etch profile sidewall angle (Θ1).

Figure 3C:
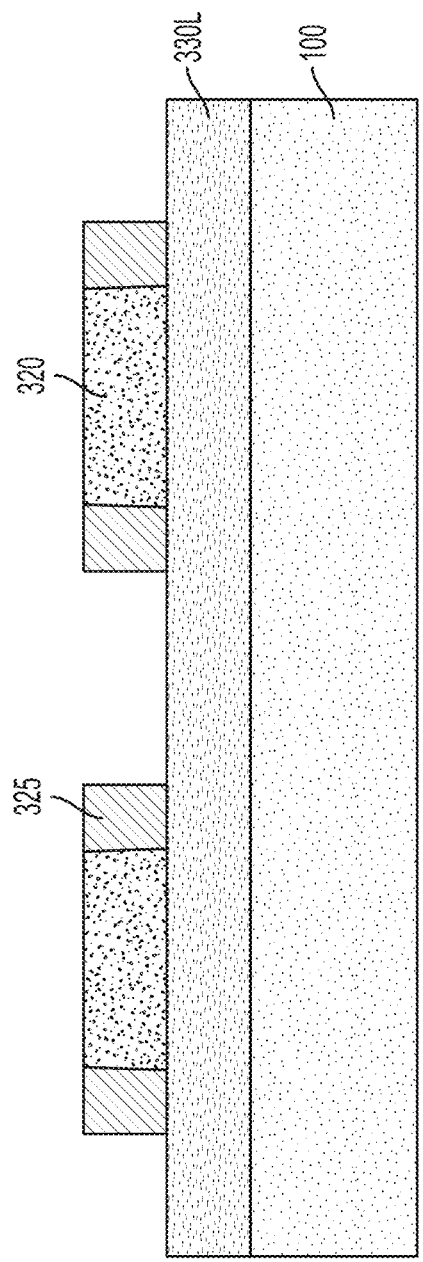

Referring to FIG. 3C, a first spacer layer 325 is formed over sidewalls of the set of first mandrels 320. In certain processes, the first spacer layer 325 may be formed using a conformal deposition process, followed by an anisotropic etch to remove the spacer layer material from horizontal surfaces.

Figure 3D:
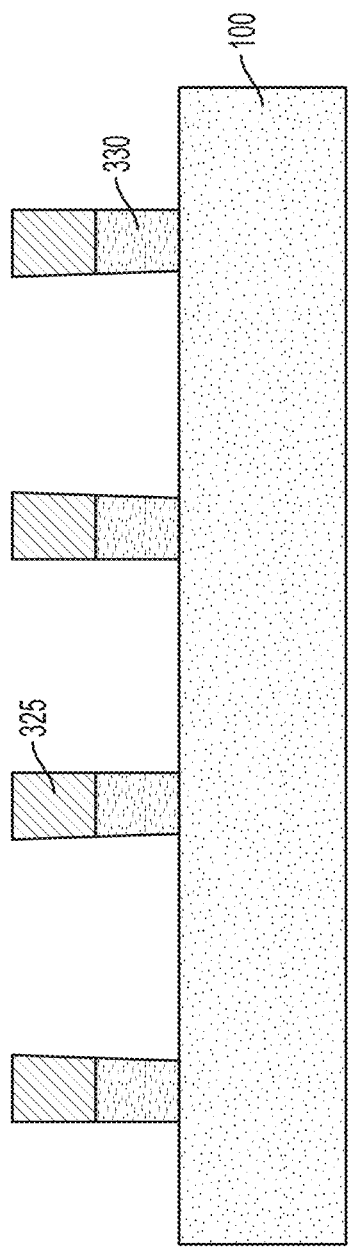
Figure 3E:
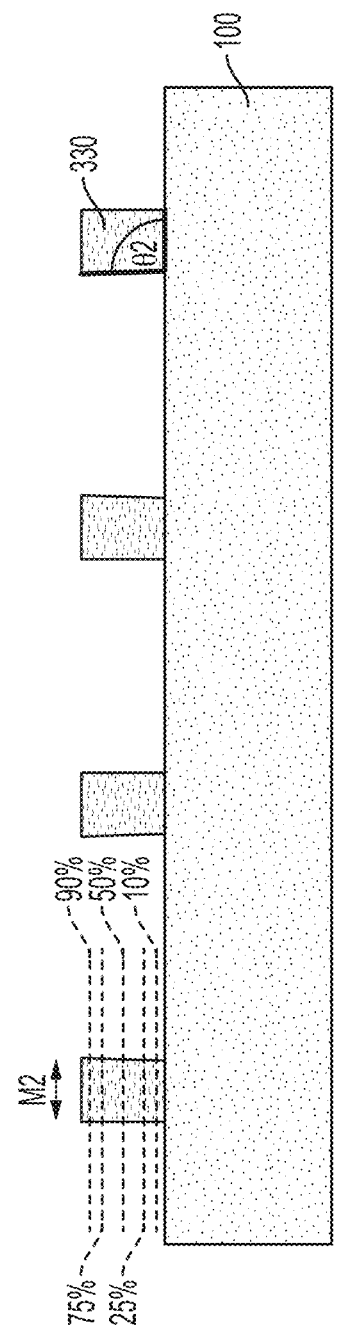

Referring to FIG. 3D, the set of first mandrels 320 is removed and, using the first spacer layer 325 as an etch mask, the pattern is transferred into the second mandrel layer 330L to form a set of second mandrels 330. Referring to FIG. 3E, the first spacer layer 325 is then removed. The set of second mandrels 330 may be characterized by a post-etch profile critical dimension (M2) and a post-etch profile sidewall angle (02).

Referring to FIG. 3F, a second spacer layer 335 is formed over sidewalls of the set of second mandrels 330. The second spacer layer 335 may be formed using a conformal deposition process, followed by an anisotropic etch to remove the spacer layer material from horizontal surfaces.

Figure 3H:
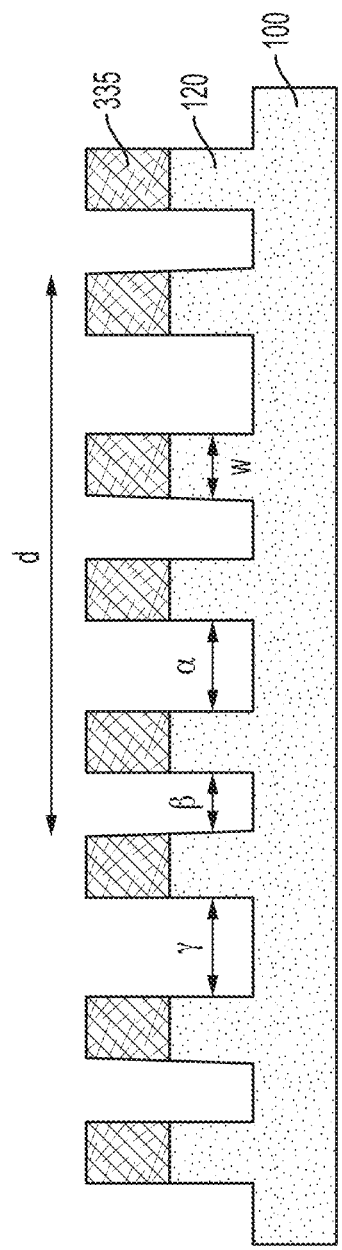

Referring to FIG. 3G, the set of second mandrels 330 is removed. As shown in FIG. 3H, using the second spacer layer 335 as an etch mask, the pattern associated with the second spacer layer 335 is transferred into the substrate 100, e.g., to form a set of fins 120.

Fins 120 are characterized by a width w, such that inter-fin dimensions $\alpha$, $\beta$ and $\gamma$ can be expressed as $\alpha=d-(M1+2M2+2w)$; $\beta=M2$; and $\gamma=M1-2w$. Various methods disclosed herein endeavor to control the design of the photomask used to generate mandrels 320, 330 in order to achieve uniformity amongst the geometric parameters $\alpha$, $\beta$, $\gamma$, and d, for example.

Various etching processes may be used to define the photoresist and mandrel structures. For example, a dry etching process such as, for example, reactive ion etching can be used. In other embodiments, a wet chemical etchant can be used. In still further embodiments, a combination of dry etching and wet etching can be used.

The term "pitch" refers to the center-to-center distance between one structure or feature (e.g., a first fin or a first mandrel) and an adjacent structure or feature (e.g., a second fin or a second mandrel). Thus, pitch (d) is equal to the sum of the width of a structure or feature and the spacing of that structure or feature to an adjacent structure or feature.

SAQP results, including the ability to control one or more of the dimensions $\alpha$, $\beta$, $\gamma$ and d, may be improved by incorporating post-lithography and post-etch structural awareness into the photomask design. In particular embodiments, data stored in a look-up table can be used to modify the photomask layout to change at least one critical dimension of the photomask layout during manufacturing. According to exemplary embodiments, modification of the photomask layout may include changing at least one critical dimension of the photomask layout based on a post-lithographic critical dimension to post-etch critical dimension bias, such as during OPC.

According to various embodiments, the look-up table can correlate post-lithography critical dimension (CD) and sidewall angle (SWA) data from the lithography stack 310, post-etch critical dimension (CD) and sidewall angle (SWA) data from the first mandrel 320, and post-etch critical dimension (CD) and sidewall angle (SWA) data from the second mandrel 330 with the CD uniformity or pitch walking value of the final device architecture. Thus, implementation of the look-up table can be used to improve the CD uniformity and/or the pitch walking value of structures such as a plurality of semiconductor fins arranged in dense, semi-dense and nested arrays on a single substrate. As used herein, a "dense" array of fins are disposed at a substantially constant periodicity of 20-100 nm, while a "semi-dense array" of fins is a more open structure where the fins may be disposed at a substantially constant periodicity of 100-300 nm, for example. A "nested" array of fins includes fins disposed at more than one periodicity. A particular example of a nested array includes both a dense array of fins and a semi-dense array of fins on the same substrate.

According to various embodiments, a constant pitch amongst a plurality of structures, e.g., fins, may be achieved by independently tuning a photomask design based on the critical dimensions associated with lithographically-defined and etched structures.

A look-up table may be generated from simulated or experimental data. A method for empirically-determining look-up table data related to lithographic and etched structures can be appreciated with reference to the critical dimension and sidewall angle values defined with reference to FIGS. 3A-3G.

The post-lithography and post-etch profiles associated with the first mandrels, and the post-etch profiles associated with the second mandrels contribute to, and therefore are predictive of the dimensions (CD and SWA) as well as the configuration, e.g., pitch, of a final device, e.g., fin structure. In connection with various approaches, the post-lithography and post-etch data are used to generate a look-up table, which can be used to form the reticle (i.e., photomask) layout for a desired integrated circuit.

In certain embodiments, a multi-dimensional look-up table includes (i) a post-lithographic photoresist critical dimension, (ii) a post-lithographic photoresist sidewall angle, (iii) a post-etch profile critical dimension, and (iv) a post-etch profile sidewall angle. In such embodiments, a method of providing a photomask layout may include lithography and etch-aware re-targeting and the attendant determination of an optimized, four parameter (i-iv) combination of the foregoing dimensions.

In certain embodiments, a multi-dimensional look-up table includes (i) a post-lithographic photoresist critical dimension and (ii) a post-lithographic photoresist sidewall angle, e.g., used to form a first mandrel, (iii) a post-etch profile critical dimension of the first mandrel, and (iv) a post-etch profile sidewall angle of the first mandrel.

In still further embodiments, a multi-dimensional look-up table includes (i) a post-lithographic photoresist critical dimension associated with the formation of a first mandrel, (ii) a post-lithographic photoresist sidewall angle, (iii) a post-etch profile critical dimension of the first mandrel, (iv) a post-etch profile sidewall angle of the first mandrel, (v) a post-etch profile critical dimension of a second mandrel, and (vi) a post-etch profile sidewall angle of the second mandrel. In such embodiments, a method of providing a photomask layout may include lithography and etch-aware re-targeting, and the determination of an optimized six parameter (i-vi) combination of the foregoing dimensions.

According to various embodiments, post-lithography and post-etch CD data may be measured at various locations of a photoresist or post-etch (e.g., mandrel) structure. As seen with reference to FIGS. 3A, 3B and 3E, for example, CD data may be measured at the top, middle or bottom portions of a feature. For instance, CD data may be determined using scanning electron microscopy (SEM) or transmission electron microscope (TEM) at 0 to 100% of the height of a feature, e.g., one or more of 0, 5, 10, 20, 30, 40, 50, 60, 70, 80, 90 or 100%.

Referring to Table 1, simulated or experimentally-determined critical dimension and sidewall angle data can be assembled for a particular feature, such as fins to be arrayed at a particular pitch for an SRAM cell or a logic cell, and the assembled data correlated to a response such as a CD uniformity value or a pitch walking value for the feature. The dimension values corresponding to the axes of exemplary Table 1 include a post-lithographic critical dimension (e.g., values a1-a4) and a post-lithographic sidewall angle (e.g., values b1-b3). The elements of the table (e.g., c11-c34) correspond to a simulated CD uniformity, for example.

TABLE 1

CD Uniformity or Pitch Walking Matrix

|  |  | Post-lithographic critical dimension (CD) values | | | |
|---|---|---|---|---|---|
|  |  | a1 | a2 | a3 | a4 |
| Post-lithographic SWA values | b1 | c11 | c12 | c13 | c14 |
|  | b2 | c21 | c22 | c23 | c24 |
|  | b3 | c31 | c32 | c33 | c34 |

For a given matrix (e.g., Table 1) an improved, such as a minimum, CD uniformity value or pitch walking value can be identified, and the corresponding dimensions selected for use in design. For instance, in the example where c23 is the minimum tabulated element of Table 1, a post-lithographic CD equal to a3, and a post-lithographic sidewall angle equal to b2 may be used.

If the photolithography process is not fixed, for example, the matrix can be used to define both the lithography process and the reticle layout CD. For instance, the lithography process can be revised to obtain the post-lithographic sidewall angle (b2), and the reticle layout CD can be revised to target the post-lithographic CD value (a3).

In certain embodiments, one the other hand, one or more tabulated dimensions may be pre-defined by process. For example, a lithography process may produce a post-lithographic sidewall angle value equal to b1, which is substantially invariant for that process. In such a case, the improved or minimum CD uniformity value or pitch walking value from the b1 row can be identified, and a correlated dimension selected. For instance, in the example where b1 is fixed, c12 is the minimum tabulated element within the b1 row, and a post-lithographic CD equal to a2, and a post-lithographic sidewall angle equal to b1 may be used. It will be appreciated that, according to various embodiments, element c23 is an absolute minimum value for Table 1 while element c12 is a relative minimum value. Furthermore, it will be appreciated that although a two-dimensional table is illustrated, higher-dimensional arrays can be assembled, e.g., using two or more of a post-lithographic critical dimension, a post-lithographic sidewall angle, a post-etch profile critical dimension of a first mandrel, a post-etch profile sidewall angle of the first mandrel, a post-etch profile critical dimension of a second mandrel, and a post-etch profile sidewall angle of the second mandrel.

In certain embodiments, plural dimension values of a multi-dimensional matrix may be fixed. Where deposition, lithographic and etch processes are confined to pre-selected conditions, for example, each of the post-lithographic sidewall angle, first mandrel post-etch profile CD and sidewall angle, and second mandrel post-etch profile CD and sidewall angle may be fixed. In such a case, the post-lithographic critical dimension corresponding to an improved or minimum CD uniformity value or pitch walking value can be identified, and equated to a reticle CD for the associated feature.

The reticle CD data can be tabulated in a look-up table, which provides, for a given feature or pattern, the design criteria for improving, e.g., minimizing, the CD uniformity value or pitch walking value in a resulting structure. An example look-up table for SRAM manufacture is Table 2. From the look-up table, an improved reticle layout CD can be determined for any given feature, such as a desired line and space pitch for an array of semiconductor fins. For instance, and by way of example, in order to realize a minimum CD uniformity value or pitch walking value for a line and space pitch equal to 80 nm, a reticle CD value of 24 nm can be chosen, while for a line and space pitch equal to 100 nm, a minimum CD uniformity value or pitch walking value can be realized by choosing a reticle CD value of 30 nm. The reticle layout CD for a conventional, comparative process is included for comparison.

TABLE 2

Look-up Table

| Line and Space Pitch (nm) | Comparative Reticle Line CD (nm) | Improved Reticle Line CD (nm) |
|---|---|---|
| 80 | 20 | 24 |
| 90 | 20 | 26 |
| 100 | 20 | 30 |
| 200 | 20 | 32 |
| 400 | 20 | 36 |
| 1000 | 20 | 38 |

As disclosed herein, a look-up table enables a lithography and etch-aware SAQP process, which can improve pitch uniformity across a plurality of fins formed over a substrate, especially for fins (or other structures) formed as dense, semi-dense or nested arrays within different regions of the substrate. In certain embodiments, device-specific look-up tables may be generated for various device architectures, including logic and memory (e.g., SRAM) functionality. The look-up table provides optimized design CDs based on lithography and etch profiles, and can be used to produce a reticle layout.

Figure 4:
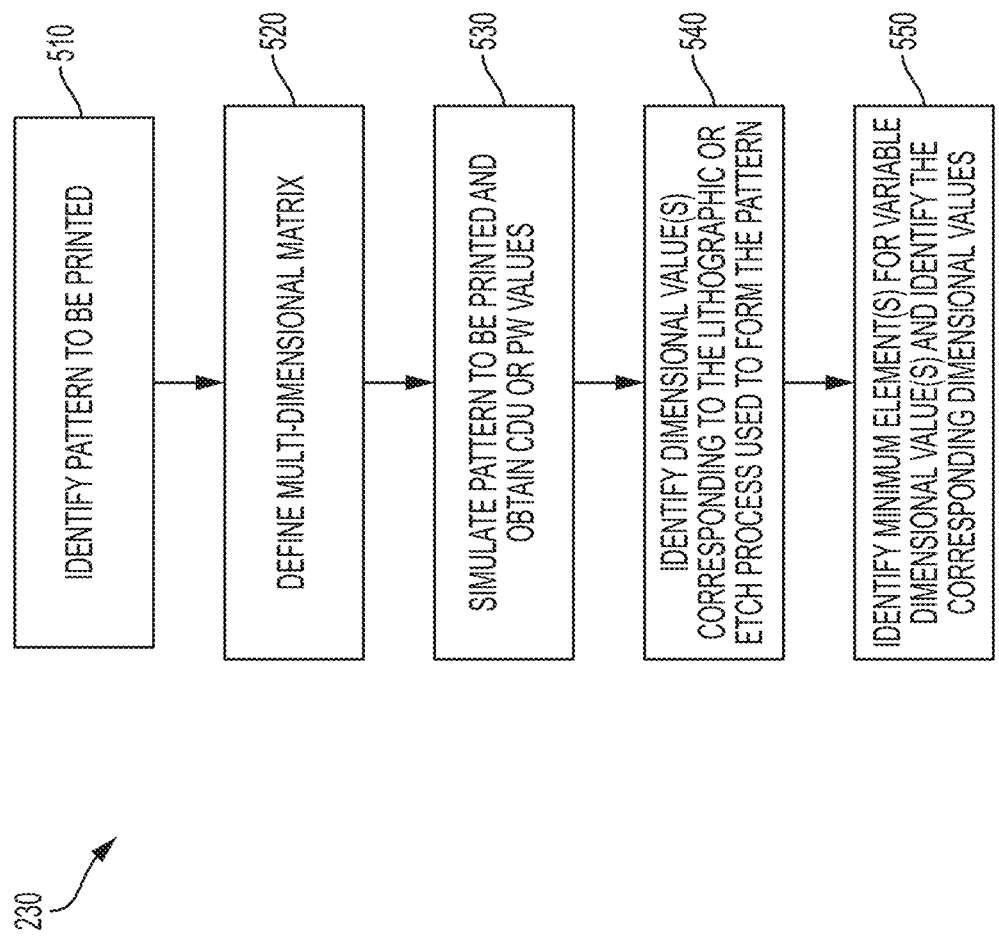
FIG. 4 is a flowchart showing the implementation of an example repair flow based on the application of a look-up table.

The look-up table enabled repair flow 230 described above with reference to FIG. 2 can be appreciated with reference also to the flowchart shown in FIG. 4. A pattern to be printed is identified (step 510). The pattern may be a line and space pattern at a given pitch, for example. A multi-dimensional matrix is then created (step 520) such as illustrated, by way of example, in Table 1. The dimensional values of the matrix may include critical dimension and sidewall angle values. A simulation of the pattern to be printed may be used to generate critical dimension uniformity (CDU) or pitch walking values for each combination of dimension values (step 530). The CDU or pitch walking values populate the elements of the matrix.

In an example repair flow, dimension values that are pre-determined (i.e., fixed) by a lithographic or etch process are identified (Step 540), and a minimum matrix element value within the row (or column) for a fixed dimension value is selected and correlated to a corresponding changeable dimension value. A changeable dimension value is one that is not pre-determined, or fixed, by the lithographic or etch process.

The look-up table, once created for a particular layout design (e.g., pitch, line width and/or critical dimension, etc.) can be used in conjunction with future layout designs having the same lithography, etch process and layer stacks.

As in the embodiment described above in connection with Table 1, for a two-dimensional matrix having post-lithographic critical dimensions and post-lithographic sidewall angles as its dimension values, where the post-lithographic sidewall angle is fixed by the lithographic process used to form the pattern, a post-lithographic critical dimension (e.g., a2) corresponding to a minimum CDU or pitch walking value (e.g., c12) can be identified (step 550).

The post-lithographic critical dimension (a2) corresponding to a minimum CD uniformity value or minimum pitch walking value is equated to a reticle CD for the associated pattern. The foregoing rubric can be repeated for different patterns, e.g., line and space patterns configured at different pitch values, and dimensional values corresponding to improved or minimal CD uniformity and/or pitching walking values can be assembled into a look-up table for future reference.

Figure 5:
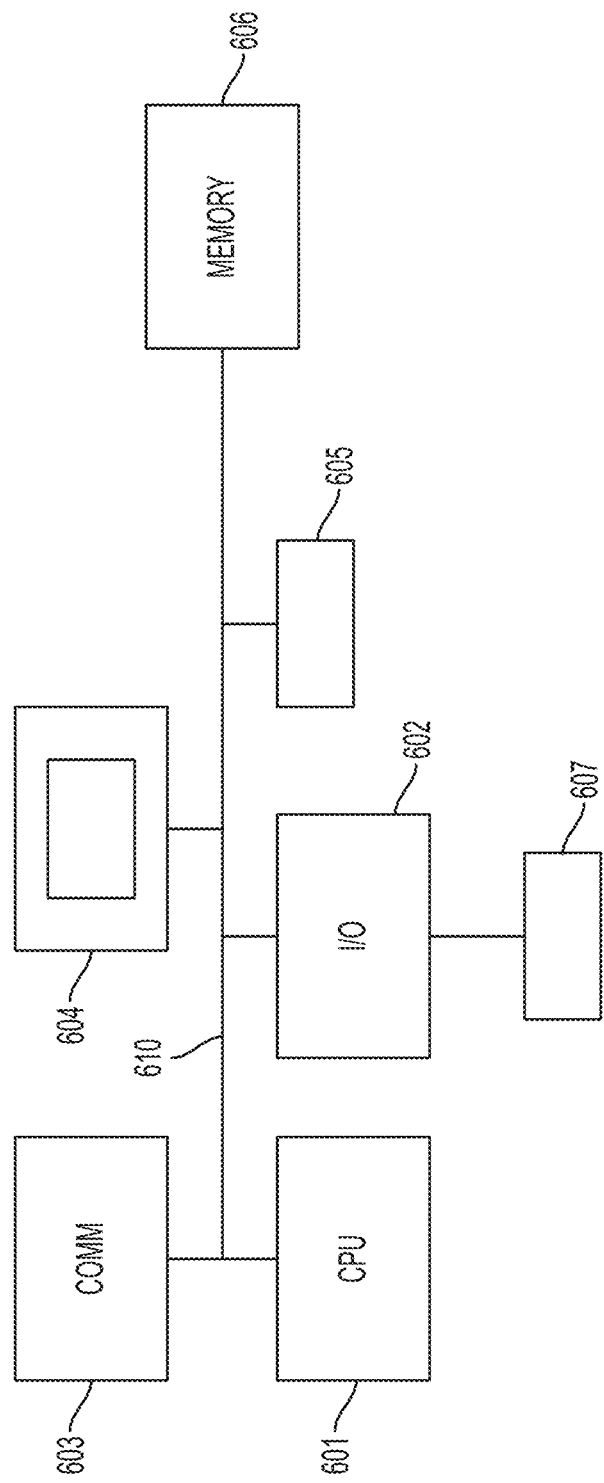
FIG. 5 is a schematic illustration of a computer system and computer program product adapted to perform the presently-disclosed method.

The disclosed methods can improve fin space uniformity, particularly for non-uniform architectures, and decrease learning cycle time and production costs. Embodiments of present method may be implemented in a digital computer, or computer system, as shown schematically in FIG. 5. Components of an exemplary computer or computer system include a central processing unit (CPU) 601, an input/output (I/O) device 602 (such as a keyboard, mouse, compact disk (CD) drive, etc.), a controller 603, a display device 604, a storage device 605 capable of reading and/or writing computer readable code, and memory 606. The foregoing are typically connected, e.g., by a bus or a communications network 610.

Various embodiments may be implemented as a computer program product stored on a computer readable medium 607, such as a tape or CD, or on the storage device 605. The computer program product contains instructions to implement the method on a computer.

As used herein, the singular forms "a," "an" and "the" include plural referents unless the context clearly dictates otherwise. Thus, for example, reference to a "look-up table" includes examples having two or more such "look-up tables" unless the context clearly indicates otherwise.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

It will be understood that when an element such as a layer, region or substrate is referred to as being formed on, deposited on, or disposed "on" or "over" another element, it can be directly on the other element or intervening elements may also be present. In contrast, when an element is referred to as being "directly on" or "directly over" another element, no intervening elements are present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a photomask layout that comprises a pattern for a fin include embodiments where a photomask layout consists essentially of a pattern for a fin and embodiments where a photomask layout consists of a pattern for a fin.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A method of providing a reticle layout for an integrated circuit, comprising:
    defining an initial reticle layout corresponding to a pattern to be printed;
    changing a critical dimension of the initial reticle layout to form a first updated reticle layout by adding a bias from a look up table, before implementing an optical proximity convergence simulation on the initial reticle layout, wherein the look up table correlates post-lithographical critical dimension (CD) data at multiple heights of a feature of the pattern, and sidewall angle (SWA) data for the feature, with a CD uniformity or pitch walking value of corresponding feature data;
    performing the optical proximity correction convergence simulation on the first updated reticle layout to form a second updated reticle layout, after adding the bias to change the critical dimension of the initial reticle layout; and
    outputting the second updated reticle layout to a mask writer.

2. The method of claim 1, further comprising adding a post-lithographic critical dimension to post-etch critical dimension bias to the initial reticle layout prior to adding the bias from the look up table.

3. The method of claim 2, wherein adding the post-lithographic critical dimension to post-etch critical dimension bias changes a critical dimension of the initial reticle layout.

4. The method of claim 1, further comprising adding a further bias from the look up table to form a third updated reticle layout if a critical dimension uniformity value of the second updated reticle layout is greater than a critical dimension uniformity value of the first updated reticle layout.

5. The method of claim 1, further comprising adding a further bias from the look up table to form a third updated reticle layout if a pitch walking value of the second updated reticle layout is greater than a pitch walking value of the first updated reticle layout.

6. The method of claim 1, wherein the pattern comprises a first region of densely-arrayed structures and a second region of semi-densely arrayed structures.

7. The method of claim 1, wherein the pattern comprises a first region of densely-arrayed structures and a second region of nested structures.

8. The method of claim 1, wherein the pattern comprises a first region of semi-densely arrayed structures and a second region of nested structures.

9. The method of claim 1, wherein the pattern comprises a first region of densely-arrayed structures, a second region of semi-densely arrayed structures, and a third region of nested structures.

10. A method of providing a reticle layout for an integrated circuit, comprising:
    defining an initial reticle layout corresponding to a pattern to be printed;
    changing a critical dimension of the initial reticle layout to form a first updated reticle layout by adding a bias from a look up table, before implementing an optical proximity convergence simulation on the initial reticle layout;
    performing the optical proximity correction convergence simulation on the first updated reticle layout to form a second updated reticle layout, after adding the bias to change the critical dimension of the initial reticle layout;

determining whether the second updated reticle layout complies with quality metric;

modifying the bias from the look up table, and repeating the optical proximity correction convergence simulation to produce a new second updated reticle layout, in response to the second updated reticle layout not complying with the quality metric; and outputting the second updated reticle layout to a mask writer in response to the second updated reticle layout complying with the quality metric.

11. The method of claim 10, further comprising adding a post-lithographic critical dimension to post-etch critical dimension bias to the initial reticle layout prior to adding the bias from the look up table.

12. The method of claim 11, wherein adding the post-lithographic critical dimension to post-etch critical dimension bias changes a critical dimension of the initial reticle layout.

13. The method of claim 10, further comprising adding a further bias from the look up table to form a third updated reticle layout if a critical dimension uniformity value of the second updated reticle layout is greater than a critical dimension uniformity value of the first updated reticle layout.

14. The method of claim 10, further comprising adding a further bias from the look up table to form a third updated reticle layout if a pitch walking value of the second updated reticle layout is greater than a pitch walking value of the first updated reticle layout.

15. The method of claim 10, wherein the pattern comprises a first region of densely-arrayed structures and a second region of semi-densely arrayed structures.

16. The method of claim 10, wherein the pattern comprises a first region of densely-arrayed structures, a second region of semi-densely arrayed structures, and a third region of nested structures.

17. A method of providing a reticle layout for an integrated circuit, comprising:

defining an initial reticle layout corresponding to a pattern to be printed;

changing a critical dimension of the initial reticle layout to form a first updated reticle layout by adding a bias from a look up table, before implementing an optical proximity convergence simulation on the initial reticle layout, wherein the look up table correlates post-lithography critical dimension (CD) and sidewall angle (SWA) data from a lithographic structure or an etch structure with a CD uniformity or pitch walking value of a final device structure;

performing the optical proximity correction convergence simulation on the first updated reticle layout to form a second updated reticle layout, after adding the bias to change the critical dimension of the initial reticle layout;

determining whether the second updated reticle layout complies with quality metric;

modifying the bias from the look up table, and repeating the optical proximity correction convergence simulation to produce a new second updated reticle layout, in response to the second updated reticle layout not complying with the quality metric; and outputting the second updated reticle layout to a mask writer in response to the second updated reticle layout complying with the quality metric.

18. The method of claim 17, further comprising adding a post-lithographic critical dimension to post-etch critical dimension bias to the initial reticle layout prior to adding the bias from the look up table, wherein adding the post-lithographic critical dimension to post-etch critical dimension bias changes a critical dimension of the initial reticle layout.

19. The method of claim 10, wherein the look up table correlates post-lithographical critical dimension (CD) data at multiple heights of a feature of the pattern, and sidewall angle (SWA) data for the feature, with a CD uniformity or pitch walking value of corresponding feature data.

20. The method of claim 15, wherein the correlated post-lithographical critical dimension (CD) data pertains to at multiple heights of a feature of the pattern.

* * * * *